United States Patent [19]

Gailbreath, Jr.

[11] Patent Number: 4,795,985

[45] Date of Patent: Jan. 3, 1989

[54] DIGITAL PHASE LOCK LOOP

[75] Inventor: Samuel H. Gailbreath, Jr., Boise, Id.

[73] Assignee: Hewlett-Packard Company, Palo Alto, Calif.

[21] Appl. No.: 140,891

[22] Filed: Dec. 23, 1987

Related U.S. Application Data

[63] Continuation of Ser. No. 847,399, Apr. 1, 1986, abandoned.

[51] Int. Cl.[4] .......................... H03K 5/13; H03K 5/22
[52] U.S. Cl. .................................. 328/155; 307/262; 328/55; 375/119
[58] Field of Search .................. 307/511, 262, 479; 328/155, 133, 55; 375/119, 118, 120; 331/1 A

[56] References Cited

U.S. PATENT DOCUMENTS

| | | | |
|---|---|---|---|
| 3,983,497 | 9/1976 | Hegeler | 328/155 |
| 4,095,186 | 6/1978 | Vesel | 328/155 |
| 4,229,824 | 10/1980 | En | 328/155 |
| 4,461,014 | 6/1984 | Fujino | 328/155 |

Primary Examiner—Stanley D. Miller
Assistant Examiner—Timothy P. Callahan
Attorney, Agent, or Firm—Leslie G. Murray

[57] ABSTRACT

A digital phase lock loop utilizing a programmable delay line to phase shift the output of a crystal generated reference clock signal and lock it to digitized data transitions recorded on a suitable medium is provided. The output of the delay line is compared to the digitized data transitions in a phase detector to determine if the delay line output leads or lags the data transitions. The delay line is then reprogrammed to reduce the phase difference between the data transition and the delay output to a minimum value.

1 Claim, 3 Drawing Sheets

DIGITAL PHASE LOCK LOOP

CROSS REFERENCE TO RELATED APPLICATION

This application is a continuation of application Ser. No. 847,399, filed 4/1/86, now abandoned.

BACKGROUND OF THE INVENTION

The present invention relates generally to phase lock loops and, more particularly, to a digital phase lock loop employing a programmable delay line to minimize phase error of a clock signal with respect to a reference signal.

Present day data recording systems record data in digital form, typically employing a coding format such as modified-frequency modulation (MFM). The data on the recording media is broken into sectors which contain synchronization fields and data fields. Each of the fields is broken up into bit cells which are precisely defined. The bits of data are coded by defining the order and positions of magnetic flux reversals or transitions within each bit cell. Thus, it is extremely important to very accurately determine the position of the flux transitions within a bit cell to be able to decode the data. The bit cell is defined by a data clock. It is necessary that the data clock be synchronized, or locked, to the data in order to define a data "window" at the proper time to correctly decode the data. A bit cell will contain one, or more, data windows; the number of data windows in a bit cell is a function of the data coding method used.

Typically, a tape or disc drive controller will include a data separator or similar circuitry, whose function is to recover the data from the coded data stream. The data separator circuitry will comprise several functional blocks including an analog phase lock loop (consisting of a phase comparator, voltage controlled oscillator (VCO), error amplifier, low pass filter and pulse synchronizing logic) to lock the data clock to the data. Analog phase lock loops are prone to locking to harmonics and are also vulnerable to noise and data drop out.

One commercially available product (designated UPD9306 Hard Disc Interface manufactured by NEC Electronics Inc.) simulates the function of an analog VCO by utilizing two delay lines. One of the external delay lines is used to generate ten equally phase-shifted reference clocks, each clock having a frequency of 10 MHz. The total delay line delay is 100 nanoseconds (ns), which is equal to the clock period. A phase comparator utilizes the second delay line to divide a bit cell into ten separate intervals. The VCO signal is synthesized by selecting one of the phase-shifted clock signals. The clock signal selected depends on where the sampling edge of the data clock falls within the bit cell. The rate at which the clock is phase-shifted in one direction or the other corresponds to an increase or decrease in resultant frequency.

SUMMARY OF THE INVENTION

In accordance with the principles of the present invention, a digital phase lock loop (DPLL) comprising a crystal oscillator, programmable delay line, phase detector and a loop control state machine is provided. A 15 MHz reference clock signal is generated by a crystal oscillator and input to a programmable delay line. The delay line provides up to 66 ns of delay, one complete period of the reference clock, programmable in discrete 2 ns steps. The output of the delay line is compared to the digitized data transitions in a phase detector. If the reference clock signal leads or lags the data transition, the delay line is programmed in a direction that minimizes the phase error between the data transitions and the reference clock signal output by the delay line.

In the preferred embodiment, the control state machine comprises an up/down counter with necessary steering and clocking logic included to program the delay line. Because the delay line is programmed in discrete 2 ns steps, the phase error will not be reduced to zero. If the data transition frequency exactly matches the 15 MHz reference clock frequency, the delay line will be programmed to alternate between adjacent 2 ns steps. The reference clock signal at the output of the delay line will have phase noise or jitter equal to + or −1 step of the delay line. This jitter is removed by a tracking band pass filter.

The digital phase lock loop of the present invention will not lock to a harmonic of the data transition frequency. Further, it is not affected by data drop out or high frequency noise bursts. The use of a loop control state machine allows the loop to be as simple or as complex as is desired. The control state machine can be easily modified to provide performance features such as very fast locking or a wide tracking range.

DETAILED DESCRIPTION OF THE PREFERRED EMBODIMENT

Figure 1:
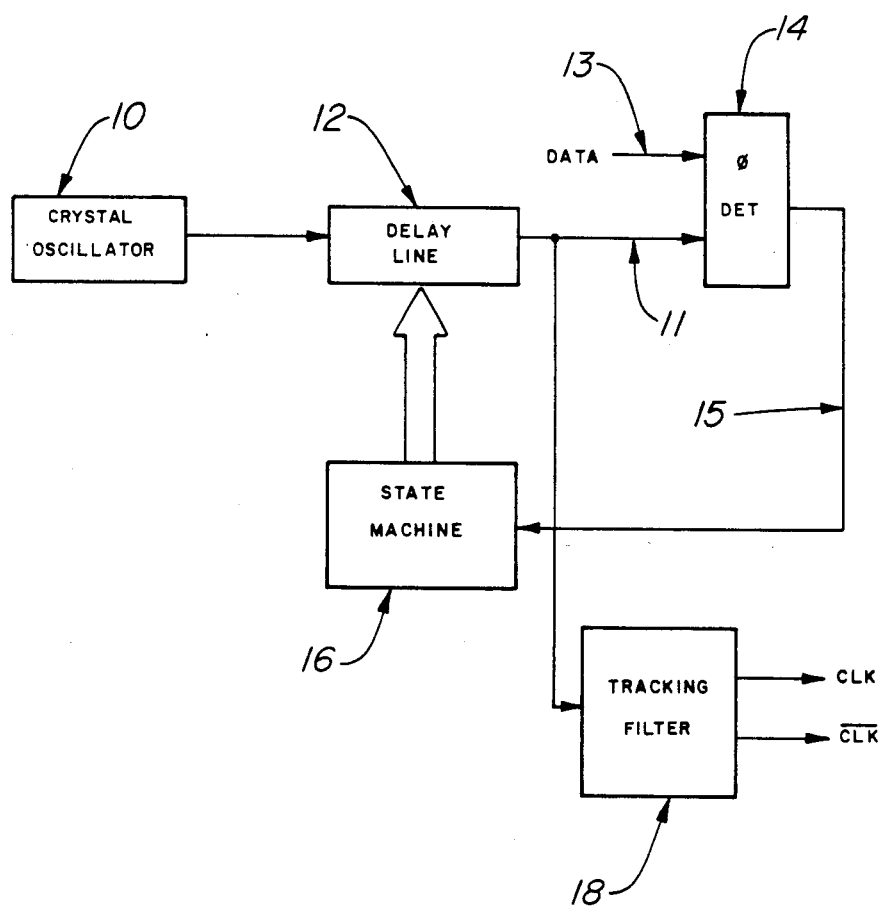
FIG. 1 is a block diagram of a digital phase lock loop according to the principles of the present invention.

Referring now to FIG. 1, a preferred embodiment according to the principles of the present invention includes crystal oscillator 10, programmable delay line 12, phase detector 14, state machine 16 and tracking filter 18. The crystal oscillator 10 generates a reference clock signal at 15 MHz which is input to the delay line 12. The output of the delay line 12 is the phase shifted reference clock 301 (DELAY CLK 301 shown in FIG. 3) on line 11. The phase shifted reference clock signal is coupled to phase detector 14 on line 11 where the rising edge of the phase shifted reference clock is compared to the rising edge of the data signal input on line 13. The phase detector 14 provides a digital signal indicative of the direction (i.e., leading or lagging) of the phase difference between the phase shifted reference clock and the data on line 15 to the state machine 16. If the phase shifted reference clock leads the data, the state machine 16 will program the delay line 12 to increase the delay of the phase shifted reference clock thereby reducing the phase difference. If the phase shifted reference clock lags the data, the state machine 16 will program the delay line 12 to reduce the amount of delay of the phase shifted reference clock with respect to the data. The delay line 2 is programmed in discrete steps on a pulse by pulse basis. Thus it may require several pulses of the data to minimize the phase difference between the phase shifted reference clock and the data. The output on line 15 of the phase detector 14 will always cause the state machine 16 to reduce the phase difference to some minimum amount and hence lock the phase shifted reference clock to the data. Since the delay line 12 can only be programmed in discrete steps, the phase difference is never reduced to zero and there will be some jitter in the phase shifted reference clock. The output of the delay line 12 is coupled to a tracking filter 18 which removes the jitter. The output of tracking filter 18 is a pair of clean, jitter-free complementary clock signals labeled CLK and CLK BAR.

In the preferred embodiment, the state machine 18 is implemented as an up/down counter that reduces the phase difference between the phase shifted reference clock and the data by a discrete amount for each pulse of the digitized data. It will be apparent to those skilled in the art that the state machine 12 may be as simple or as complicated as desired. For example, the state machine 12 may be a microprocessor programmed to use a successive approximation method to reduce the phase difference to a minimum value. Further, delay line 12 may be implemented in such a manner as to provide a continuously adjustable amount of delay over any desired range and, thus, reduce the phase difference to zero rather than to some minimum value.

Figure 2:
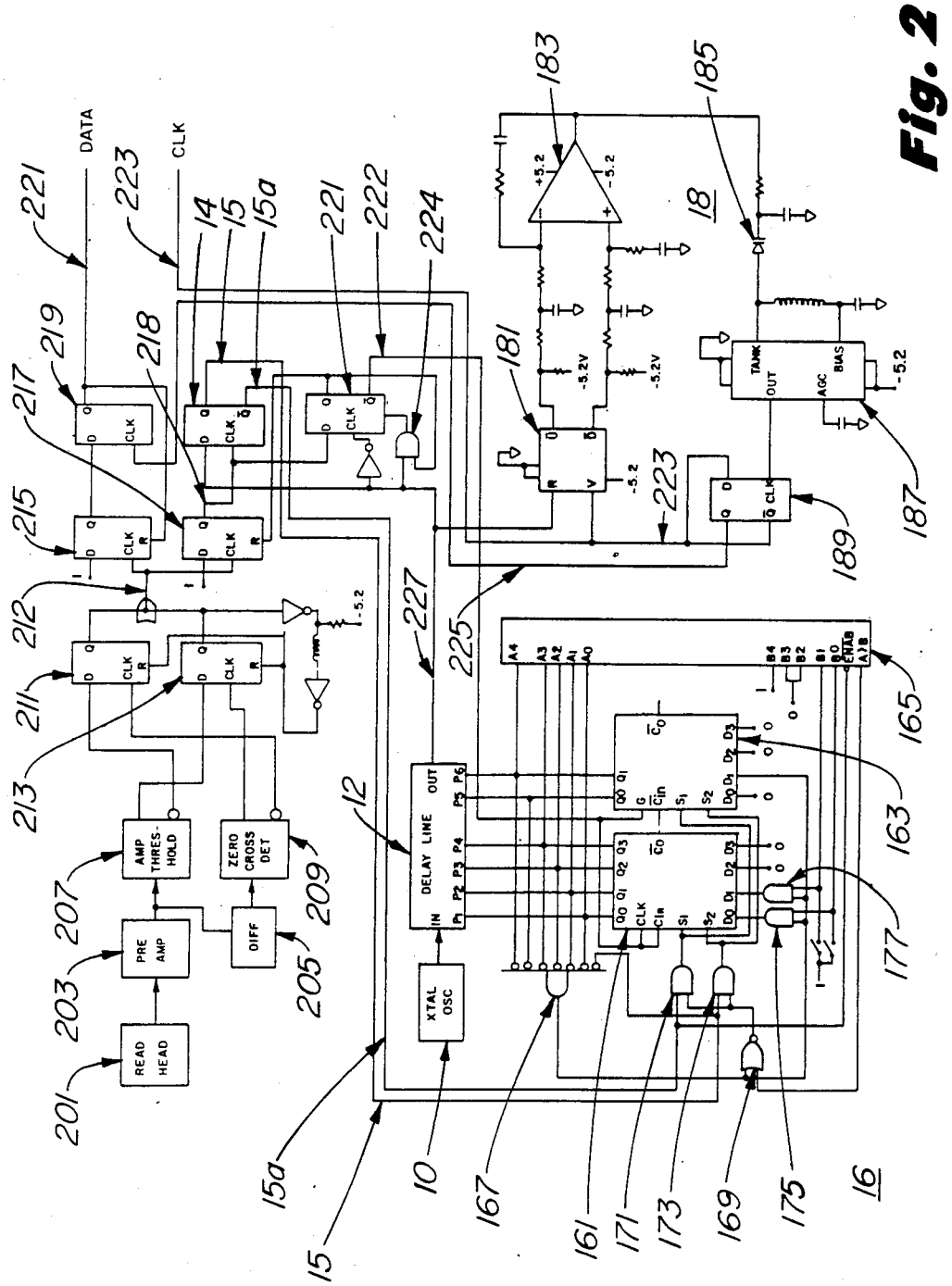
FIG. 2 is a schematic diagram of the digital phase lock loop shown in FIG. 1 as implemented in the preferred embodiment.
Figure 3A:
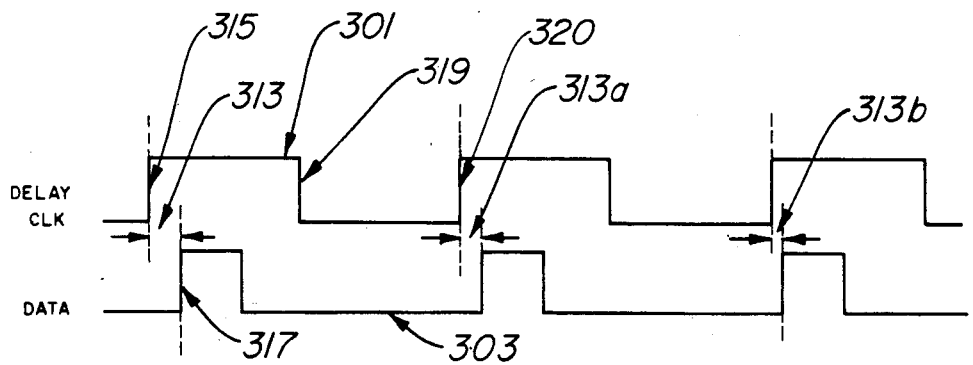
FIGS. 3a, 3b and 3c are waveform diagrams illustrating the phase relationship of signals to which reference will be made in describing the operation of the digital phase lock loop.
Figure 3B:
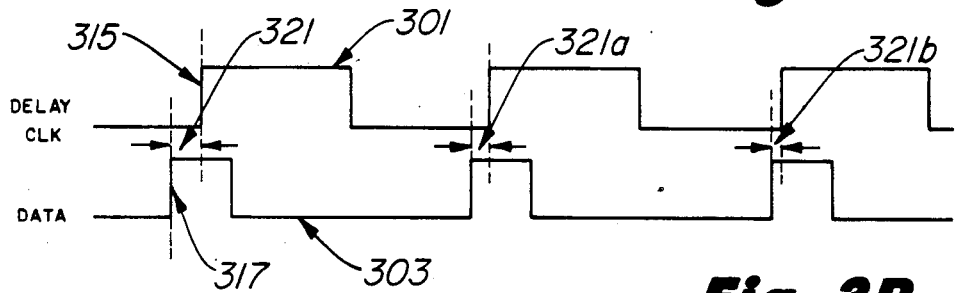
Figure 3C:
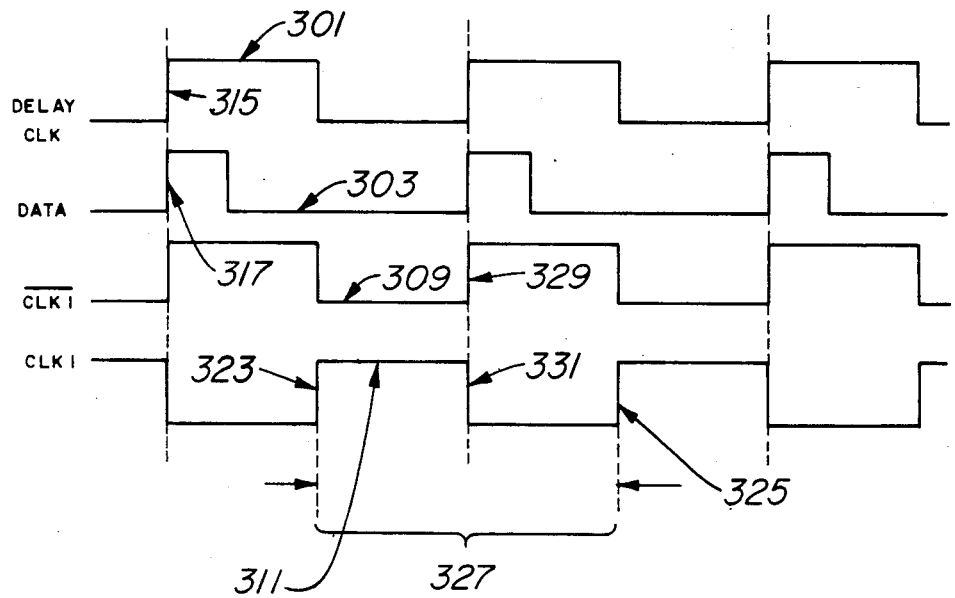

Referring now to FIGS. 2 and 3, in a helical scan tape recorder, read head 201 is one of two heads (not shown) mounted on a rotary drum (not shown). Read head 201 detects magnetic transitions recorded on magnetic recording media (not shown) and outputs a data signal representative of the data recorded on the media. The data signal is coupled via preamplifier 203 to amplitude threshold detector 207 and differentiator 205. The two ouputs of the amplitude threshold detector 207 are coupled to the D inputs of flip-flops 211 and 213. The ouput of differentiator 205 is coupled to the zero-crossing detector 209. Complementary ouputs of the zero-crossing detector 209 are coupled to the CLK input of flip-flops 211 and 213. The Q outputs of flip-flops 211 and 213 are wire-OR'ed together and output a digitized data signal (waveform 303 as shown in FIG. 3) on line 212 having a rising edge which corresponds to each transition recorded on the media (not shown). The data signal on line 212 is coupled to the CLK input of flip-flops 215 and 217. The D input of flip-flops 215 and 217 is held high so that each time the data signal on line 212 clocks flip-flops 215 and 217, the Q output of flip-flops 215 and 217 goes high. The output of flip-flop 215 is coupled to the D input of flip-flop 219 and the output of flip-flop 217 on line 218 is coupled to the CLK input of the phase detector 14 and to the D input of flip-flop 221. (Motorola high speed ECL flip-flop circuits designated as MC10H131 were used in the implementation shown.)

The reference clock signal is provided by the crystal oscillator 10. In the preferred embodiment, crystal oscillator 10 comprises a 30 MHz crystal controller oscillator and a divide-by-two flip-flop (not shown) to provide the 15 MHz reference clock to the delay line 12. Delay line 12 comprises an ECL compatible 6-bit delay line programmable in 2 nanosecond (ns) discrete steps (a delay line designated ESP-114 manufactured by Rhombus Industries is suitable for this purpose). Delay line 12 is programmed by the state machine 16. State machine 16 comprises two up/down counters 161, 163 (ECL compatible high speed counter chips designated as MC10H136 manufactured by Motorola are suitable for this purpose), maximum phase shift detector 165, zero phase shift detector 167 and the necessary ECL logic gates 169, 171, 173, 175 and 177 to load and control the counters 161, 163. The delay line 12 outputs the phase shifted reference clock signal 301 on line 227.

The phase shifted reference clock 301 on line 227 is coupled to the D input of phase detector 14 which determines whether the rising edge 315 is leading or lagging the rising edge 317 of the data signal 303 on line 218. If the D input of phase detector 14 is high when the data pulse on line 218 clocks phase detector 14, the Q output on line 15 goes high and the QBAR output on line 15a goes low, indicating that the rising edge 315 of the reference clock 301 is leading rising edge 317 of the data signal 303. The Q and QBAR outputs of the phase detector 14 are coupled to AND gates 173 and 171 on lines 15 and 15a, respectively. The Q and QBAR ouputs on lines 15 and 15a are AND'ed with the output of NOR gate 169 and coupled to the S2 and S1 inputs of counters 161 and 163, respectively. Counters 161 and 163 are clocked by the QBAR output of flip-flop 221 on line 222 going high. Flip-flop 221 is clocked by the inverted falling edge 319 of the phase shifted reference clock 301 on line 227. The D input of flip-flop 221 goes high following the rising edge of the data signal on line 218; when flip-flop 221 is clocked, the Q output goes high resetting flip-flop 217 and driving line 218 low, and the QBAR output on line 222 goes low. The Q output of flip-flop 221 is also coupled to one input of AND gate 224; the phase shifted reference clock on line 227 is coupled to the other input of AND gate 224. On the next positive edge 320 of the phase shifted reference clock 301, flip-flop 221 is reset causing the QBAR output on line 222 to go high which increments the counters 161 and 163 to reprogram the delay line 12 to increase the delay by one 2 ns-step. Utilizing the rising edge 320 to generate the counter clock pulse on line 222 ensures that a reference clock rising edge 315 will not be propagating through the delay line 12 when the delay line 12 programming is changed.

The delay line 12 is only incremented (or decremented) one 2 ns step at a time. Therefore, as shown in FIGS. 3a and 3b, several rising edges of the digitized data signal 317 are required to reduce the phase difference 313, 313a, 313b to a minimum value. Delay line 12 can be programmed for up to 66 ns of delay which is slightly less than 360 degrees of phase shift. If the maximum shift detector 165 detects that 66 ns of delay has been programmed and the phase detector 14 indicates that additional delay is required, the counters 161, 163 will be loaded to reprogram the delay line 12 to zero delay, in effect shifting the phase shifted reference clock 301 by 360 degrees so that the delay can be further incremented. Similarly, if the zero phase shift detector 167 detects that the delay line 12 has been programmed for zero delay and the phase detector 14 indicates that less delay is required, the counters 161, 163 will be loaded to reprogram the delay line 12 for 66 ns delay, in effect shifting the phase shifted reference clock 301 by 360 degrees so that the amount of delay can be further decremented.

The phase detector 14 detects whether the phase shifted reference clock rising edge 315 is leading or lagging the data rising edge 317 but does not measure the magnitude 313, 321 of the phase difference. Because the delay line 12 is digital, the phase difference 313, 315 will never be reduced to zero; the phase shifted reference clock will always have a small amount of jitter relative to the data, even when the phase shifted reference clock 301 is locked to the data 303. The phase shifted reference clock 301 on line 227 is coupled to an analog phase lock loop 18 which acts as a tracking filter to remove jitter or phase noise from the phase shifted reference clock 301.

Phase lock loop 18 comprises a phase detector 181, opamp 183, a voltage controlled oscillator 187 and flip-flop 189. Phase lock loop 18 operates in a conventional manner with phase detector 181 providing a voltage control signal indicative of the phase difference between the phase shifted reference clock 301 on line 227 and the clock signal on line 223. The voltage control signal is filtered and amplified in opamp 183 and applied to varactor diode 185. Varactor diode 185 acts as a voltage-controlled capacitor in a conventional tank circuit which is nominally tuned to 30 MHz. The voltage control signal controls the capacitance of varactor diode 185 to lock the loop to the phase shifted reference clock 301. Flip-flop 189 divides the output of the voltage controlled oscillator 187 by two and provides a pair of complementary clock signals CLK1 311 and CLK1BAR 309 at 15 MHz at the Q and QBAR outputs of flip-flop 189 on lines 225 and 223 respectively. In the preferred embodiment shown in FIG. 2, the rising edge of CLK1BAR 309 is phase locked to the rising edge of the phase shifted reference clock 301.

Complementary clock signal CLK1BAR 309 on line 223 is coupled to data decoding circuits (not shown). Complementary clock signal CLK1 311 on line 225 is coupled to the CLK input of flip-flop 219 where rising edges 323 and 325 define the boundaries of a one-half bit cell 327. Rising edges 317 of the data signal 303 are coupled to the D input of flip-flop 219. A rising edge 317 arriving within the boundaries of the one-half bit cell 327 results in the D input of flip-flop 219 going high resulting in the Q output going high when rising edge 325 clocks flip-flop 219. The Q output of flip-flop 219 is coupled to the reset input of flip-flop 215 and to data decoding circuitry (not shown) on line 221.

Having described a specific preferred embodiment of the present invention with reference to the accompanying drawings, it is to be understood that the invention is not limited to the precise embodiment described, and that various changes and modifications may be affected therein by one skilled in the art without departing from the scope or spirit of the invention as defined in the appended claims.

I claim:

1. A digital phase-locked loop for providing an output signal which is phase-locked to an input signal wherein said input signal comprises a plurality of successive data bits having a nominal frequency, said phase-locked loop comprising:

input means for receiving said input signals;

signal generator means for generating a reference signal comprising a plurality of successive bits, said reference signal having a predetermined frequency;

a programmable delay line coupled to said signal generator for shifting the phase of said reference signal on a bit-by-bit basis with respect to the phase of said input signal to provide said output signal, said delay line divided into a plurality of equal and discrete time steps, said delay line programmed to delay a bit of said reference signal an integer number of said discrete time steps with respect to a corresponding bit of said input signal;

phase detector means coupled to said input means and to said programmable delay line for detecting a phase difference on a bit-by-bit basis between said input signal and said output signal and for generating a control signal indicative of whether a bit of said output signal is leading or lagging a corresponding bit of said input signal; and control means coupled to said programmable delay line and to said phase detector means responsive to said control signal incrementing or decrementing said integer number of discrete time steps by one of said discrete time steps for each said phase comparison between a bit of said output signal and a corresponding bit of said input signal to shift the phase of a successive bit of said reference signal by one said discrete time step with respect to said bit of said output signal thereby reducing the phase difference between a successive bit of said output signal and a corresponding successive bit of said input signal.

* * * * *